United States Patent
Hu

(10) Patent No.: US 7,696,668 B2
(45) Date of Patent: Apr. 13, 2010

(54) SOLID STATE TRANSPORT-BASED THERMOELECTRIC CONVERTER

(75) Inventor: Zhiyu Hu, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 393 days.

(21) Appl. No.: 11/926,934

(22) Filed: Oct. 29, 2007

(65) Prior Publication Data

US 2009/0107535 A1    Apr. 30, 2009

(51) Int. Cl.
G21H 1/00    (2006.01)
H02N 10/00    (2006.01)
H01L 35/00    (2006.01)
H01L 37/00    (2006.01)

(52) U.S. Cl. ............. 310/305; 310/306; 322/2 R; 62/2.3; 136/200; 136/205; 136/211; 136/237

(58) Field of Classification Search ........... 310/305, 310/306; 322/2 R; 62/3.2; 136/200, 205, 136/211, 237
See application file for complete search history.

(56) References Cited

U.S. PATENT DOCUMENTS

| | | | |
|---|---|---|---|
| 3,169,200 | A | 2/1965 | Huffman |
| 3,211,096 | A * | 10/1965 | Forney et al. ............ 102/202.5 |
| 4,700,099 | A | 10/1987 | Iden |
| 6,117,344 | A | 9/2000 | Cox et al. |
| 6,376,763 | B2 | 4/2002 | Funahashi et al. |
| 6,396,191 | B1 | 5/2002 | Hagelstein et al. |
| 6,489,704 | B1 * | 12/2002 | Kucherov et al. ........... 310/306 |
| 6,563,256 | B1 | 5/2003 | Zavadil et al. |
| 6,774,532 | B1 | 8/2004 | Marshall et al. |
| 6,914,329 | B1 * | 7/2005 | Lee et al. .................... 257/712 |
| 7,109,408 | B2 | 9/2006 | Kucherov et al. |
| 2004/0101750 | A1 | 5/2004 | Burch |

FOREIGN PATENT DOCUMENTS

WO    WO 00/59047    10/2000
WO    WO 2006/021009    2/2006

OTHER PUBLICATIONS

Min et al., A novel thermoelectric converter employing Fermi gas/liquid interfaces, J. Phys. D: Appl. Phys, 32 (1999).
Funahashi et al., An Oxide Single Crystal with High Thermoelectric Performance in Air, Jpn. J. Appl. Phys., vol. 39 (2000), pt. 2, No. 11B, pp. L1127-L1129.

(Continued)

*Primary Examiner*—Thomas M Dougherty
(74) *Attorney, Agent, or Firm*—Novak Druce +Quigg; Gregory A. Nelson; Gregory M. Lefkowitz

(57) ABSTRACT

A solid state thermoelectric converter includes a thermally insulating separator layer, a semiconducting collector and an electron emitter. The electron emitter comprises a metal nanoparticle layer or plurality of metal nanocatalyst particles disposed on one side of said separator layer. A first electrically conductive lead is electrically coupled to the electron emitter. The collector layer is disposed on the other side of the separator layer, wherein the thickness of the separator layer is less than 1 μm. A second conductive lead is electrically coupled to the collector layer.

25 Claims, 10 Drawing Sheets

OTHER PUBLICATIONS

Hu et al., Nanocatalytic Spontaneous Ignition and Self-Supporting Room-Temperature Combustion, Energy & Fuels, 2005, 19, pp. 855-858.

Moyzhes et al., The thermionic energy converter as a topping cycle for more efficient heat engines—new triode designs with a longitudinal magnetic field, J. Phys. D: Appl. Phys. 38 (2005), pp. 782-786.

McKee et al., The Interface Phase and the Schottky Barrier for a Crystalline Dielectric on Silicon, Science 300 (2003), pp. 1726-1730.

McKee et al., Physical Structure and Inversion Charge at a Semiconductor Interface with a Crystalline Oxide, Science 293 (2001), pp. 468-471.

Androulakis et al., La0.95Sr0.05CoO3: An efficient room-temperature thermoelectric oxide, Inst. Elect. Structure & Laser, Foundation for Research & Technology—Hellas, Crete, Greece (2004).

Forman, Krypton Filled Thermionic Converter, Quart. Tech. Progress Report No. 2 (Jul. 1963), US Air Force, Wright-Patterson Air Force Base, Ohio.

Marsh et al., The Seebeck Coefficient in Transition-Metal-Oxide-Perovskites, Amer.Physical Society, Annual March Meeting, Mar. 17-22, 1996, abstract #C10.10 (abstract only).

Luke, Advanced Thermionic Converter Technology Development, AIP Conf. Proc., Feb. 6, 2005, vol. 746, pp. 918-925 (abstract only).

Musa, A new concept of thermionic converter, J. Phys. D: Appl. Phys. 12, 1979, pp. L37-L40.

Bates, C.W. Jr. (Apr. 1995) Low-temperature thermionic emitters using metal-semiconductor composites, Materials Letters, 23: 1-5.

Hagelstein, P.L. (Jul. 15, 2002) Enhanced figure of merit in thermal to electrical energy conversion using diode structures, Applied Physics Letters, 81 (3): 559-561.

Hu, Zhiyu (May 2006) Nanoscale Energy Conversion by Using Nano-Catalytic Particles, Proceedings of PWR2006: 545-550.

* cited by examiner (a)

(b)

(c)

SOLID STATE TRANSPORT-BASED THERMOELECTRIC CONVERTER

STATEMENT REGARDING FEDERALLY SPONSORED RESEARCH OR DEVELOPMENT

This invention was made with government support under Contract No. DE-AC05-00OR22725 between the United States Department of Energy and UT-Battelle, LLC. The government has certain rights in this invention.

CROSS REFERENCE TO RELATED APPLICATIONS

Not applicable.

FIELD OF THE INVENTION

The invention relates to thermoelectric converters based on thermionic emission.

BACKGROUND

Thermoelectricity is the conversion from temperature differentials to electricity or vice versa. Thermoelectricity can be accomplished based on the Peltier-Seebeck effect, thermionic emission, or indirectly through magnetohydrodynamics.

Thermionic emission refers to the flow of electrons from a metal or metal oxide surface, caused by thermal vibrational energy overcoming the electrostatic forces holding electrons to atoms or molecules at the surface. This effect increases dramatically with increasing temperature (1000-3000 K), but is always present at temperatures above absolute zero. The science dealing with this phenomenon is thermionics. The charged particles are referred to as thermions.

Owen Willans Richardson worked with thermionic emission and received a Nobel prize in 1928 for his work on the thermionic phenomenon. Regarding Richardson's Law, in any metal, there are generally one or two electrons per atom that are free to move from atom to atom. This is sometimes referred to as a "sea of electrons". Their velocities follow a statistical distribution, rather than being uniform, and occasionally an electron will have enough velocity to exit the metal without being pulled back in. The minimum amount of energy needed for an electron to leave the surface is referred to as the work function, and varies from metal to metal. A thin oxide coating is often applied to metal surfaces in vacuum tubes to provide a lower work function, as it is generally easier for electrons to leave the surface of the oxide. Richardson's Law, also called the Richardson-Dushmann equation, states that the emitted thermionic current density J (A/m$^2$) is related to temperature T by the equation:

$$J = AT^2 e^{-W/kT}$$

where T is the metal temperature in kelvins, W is the work function of the metal, and k is the Boltzmann constant. The proportionality constant A, known as Richardson's constant, given by $$A = \frac{4\pi m k^2 e}{h^3} = 1.20173 \times 10^6 \frac{A}{m^2 k^2}$$

where m and e are the mass and charge of an electron, and h is Planck's constant. Because of the exponential function, the current increases rapidly with temperature when T is less than W. At higher temperatures the increase is quadratic in T.

The Richardson-Dushman equation must generally be corrected for the Schottky Effect. The current emitted from the metal cathode into the vacuum depends on the metal's thermionic work function, and that this function is lowered by its normal value by the presence of image forces and by the electric field at this cathode. This enhancement is given by the Field-enhanced thermionic emission (FEE) equation:

$$J(E_s, T, W) = AT^2 e^{-(W-\Delta W)/kT}$$

$$\Delta W = [eE_c/(4\pi \in_0)]^{1/2}$$

where $E_c$ is the electric field strength at the cathode spot, and $\in_0$ is the vacuum permittivity. This equation is relatively accurate for electric field strengths lower than about $10^8$ V m$^{-1}$. For electric field strengths higher than $10^8$ V m$^{-1}$ the use of the Murphy and Good equation for thermo-field (T-F) emission is more appropriate.

The conversion of heat to electricity by thermoelectric devices based on thermionics may play a key role in the future for energy production and utilization and thus begin replacing batteries. However, in order to meet that role, more efficient thermoelectric materials are needed that are suitable for high-temperature applications. Thermoelectric devices are generally based on heavily doped semiconductors and utilize transport through a vacuum, such as a hot electron emitter separated by a vacuum gap, or a vacuum gap filled with alkali metal gas such that alkali cations that act as counterions to improve the electron transport through the insulating gap region. Thermoelectric devices can be used for cooling applications or for electricity generation directly from a heat source.

A broad search has been under way to identify new materials with enhanced thermoelectric properties. Although the emphasis has been on finding materials that are superior to the well-known $Bi_{2-x}Sb_xTe_{3-y}Se_y$ alloys used in cooling, interest in developing materials with high ZT values (high efficiency at high temperature) for direct energy conversion has been increasing. The figure of merit for the material of a thermionic converter is given as follows as a dimensionless quantity ZT as follows:

$$ZT = (\sigma S^2/\kappa)T,$$

where σ is the electrical conductivity of the converter from end to end, S is the thermopower or Seebeck coefficient of the converter, and K is the thermal conductivity of the material between the hot emitter and the cold collector side, and T is the temperature. The numerator ($\sigma S^2$) is referred to as the "power factor". Several classes of materials are currently under investigation for use in thermionic converters, including complex chalcogenides, skutterudites, half-Heusler alloys, metal oxides, intermetallic clathrates, and pentatellurides. In addition, artificial superlattice thin-film structures grown from chemical vapor deposition, such as $Bi_2Te_3$/$Sb_2Te_3$, and by molecular beam epitaxy (MBE), such as $PbSe_{0.98}Te_{0.02}$/PbTe, have been introduced with substantially enhanced ZT values relative to those of their bulk counterparts. Marking an important development in this area, specially constructed $Bi_2Te_3$/$Sb_2Te_3$ superlattices were reported to exhibit a very high ZT of ~2.4 at room temperature. The MBE-grown thin-film $PbSe_{0.98}Te_{0.02}$/PbTe systems feature peculiar pyramidal-shaped "nanodots" of PbSe that form spontaneously (surrounded by the higher band gap matrix material PbTe). The resulting samples possess a ZT of ~2 at elevated temperatures (about 500 to 700 K). Nevertheless, because the vast majority of applications require materials in large (bulk) quantities, it would therefore be desirable to have compositions that generate similar ZT values in a bulk material.

BRIEF DESCRIPTION OF THE DRAWINGS

A fuller understanding of the present invention and the features and benefits thereof will be accomplished upon review of the following detailed description together with the accompanying drawings, in which.

SUMMARY OF THE INVENTION

Figure 1A:
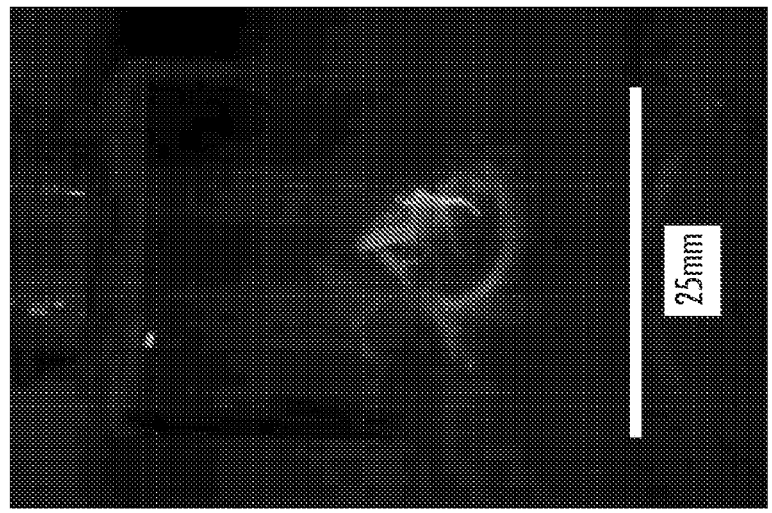
FIG. 1(a) shows a visible light optical photograph of Pt nanoparticle-loaded quartz glass wool (10-μm diameter) self-heated to red/orange hot in methanol vapor at room temperature.

A solid state thermoelectric converter has a thermally insulating separator layer with an electron emitter on one side of a separator layer and a collector layer disposed on another side of the separator layer. The emitter layer and the collector layer can be connected with a conductor to complete an electrical circuit.

The electron emitter can be a metal nanocatalytic layer or a plurality of metal nanocatalyst particles disposed on the separator layer. The metal nanocatalyst particles can have an average size of less than 200 nm where the metal can be selected from the group of consisting of Au, Pt, Ru, Rh, Pd, Ag, Cu, Zn, Fe, Ni, and Mn, and alloys thereof.

The collector layer can be a semiconductor, such as Si or Ge. The solid-to-solid electron emissions occur through a separator layer that is thinner than the mean free path of an electron and can have a thickness of 1 μm to 1 nm. The separator layer can be a nanostructured layer which can be a crystalline metal oxide. An alkaline earth oxide can be used as the separator layer with a Si collector layer which can have an alkaline earth silicide at the interface of the collector and separator layers. The conduction band offset of a conduction band of the separator layer to a conduction band of the collector layer can be less than 2.5 eV. The separator can be a metal oxide of the structure $(AO)_n(A'BO_3)_m$ wherein A and A' are one or more alkaline earth metals, B is titanium, n is 0 to 3 and m is 0 to 100. The metal oxide can be $SrTiO_3$ with a Si collector layer and can be $BaTiO_3$ with a Ge collector layer.

A thermoelectric system for generating electricity can include at least one thermoelectric converter as described above disposed on or within a substrate, with a fluidic system coupled to the converter to deliver a fuel and an oxidant to the emitters of the converters. The system can have two or more converters that can be electrically connected in series, parallel or a combination of series and parallel. The fluidic system can be disposed on or within the substrate. The fluidic system can be connected to a reservoir for storage of a fuel. The fuel can be hydrogen, a hydrocarbon or an alcohol. The fluidic system can provide cooling to the converter.

A thermoelectric method of generating electricity includes the steps of: providing at least one thermionic converter as described above, supplying a fuel and an oxidant to the electron emitter of the converters where the fuel and oxidant spontaneously react on the surface of the metal nanoparticles of the emitter generating heat sufficient to cause thermionic emission of electrons, solid-to-solid emitting of electrons through the separator layer to the collector layer of the converter, where the emitter and the collector layer are electrically connected to complete a circuit. The method can include combining the output from a plurality of converters. The method can be used to supply power to a portable electronic device such as a personal digital assistant (PDA), cellular phone or laptop computer.

DETAILED DESCRIPTION

A solid state thermoelectric converter includes a thermally insulating separator layer, and an electron emitter comprising a metal nanocatalytic layer or plurality of dispersed metal nanocatalyst particles disposed on one side of the separator layer. A first electrically conductive lead is electrically coupled to the electron emitter. A collector layer is disposed on the other side, opposite the emitter, of the separator layer, wherein the thickness of the separator layer is less than 1 μm. A second conductive lead is electrically coupled to the collector layer. Prior art thermionic emission have been exclusively solid-to-vacuum emissions, however, in the case of the present invention, thermionic emissions are solid-to-solid emission as described below.

Figure 1B:
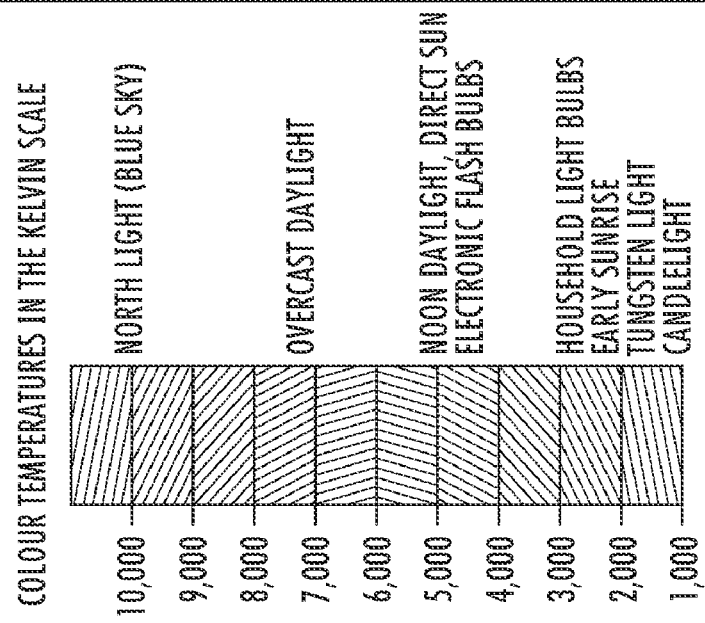
FIG. 1(b) shows a temperature scale which indicates temperatures in Kelvins (K) of an ideal black body radiator as a light source where the scale reflects the temperature gradient but not the absolute temperatures indicated by scale in FIG. 1(c).
Figure 1C:
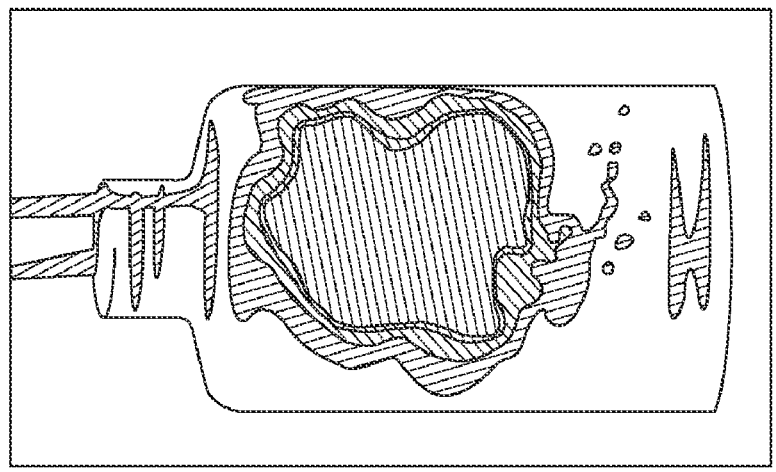
FIG. 1(c) shows an infrared photograph of Pt nanoparticle-loaded quartz glass wool (10-μm diameter) self-heated in methanol vapor indicating a localized high temperature region (the dark center suspended in the jar) and high thermal gradient proceeding from that high temperature region.

As is commonly known, most combustion or burning processes are initiated by heat and/or spark and take place and are sustained at temperatures which are much higher than human body temperature (>100° C.). However, a recent paper by one of the present inventors Z. Hu, et al, *Energy & Fuels* 19:855 (2005), hereafter the "Hu paper", which is incorporated by reference into the present application in its entirety, demonstrates that by manipulating a methanol/air supply, combustion of methanol fuel can be initiated and sustained around room temperature without a spark. In one experiment disclosed, illustrated in FIG. 1, supported Pt nanoparticles (~50 nm-700 nm diameter) were shown to self-heat (in seconds) up to more than 1,000 K emitting a red glow (FIG. 1(a)) without any external ignition and conventional gas phase burning processes. The reaction is readily controlled by changing the methanol/oxidant flow. Infrared photograph 1(c) reveals that Pt nanoparticles retain the highly localized heating at the nanoscale. The thermal gradient of a nanocatalytic layer comprising Pt nanoparticle to the surrounding environment could be as high as 1,000 K over a few hundreds micrometers in distance, which is about a 100-1,000 times steeper gradient than what is achievable in macroscale (e.g. bulk), especially when the cool side is at or near room temperature. FIG. 1(b) is a grayscale chart for the heat required to give an emission from a black body, that qualitatively indicates a relative temperature gradient displayed in FIG. 1(c) where the bottom of the chart corresponds to the center of the infrared image and the top of the chart is reflected in the outside edges of the infrared image.

The present invention utilizes the highly localized heating to high temperature and extremely high thermal gradients as disclosed in the Hu paper for constructing nano or microscale thermoelectric converters. It has been found that the thermal penetration and propagation from the hot source to cool source can be limited significantly. This leads to a higher Carnot efficiency ($\eta_{Carnot}=1-T_c/T_h$) based on a significant reduction in heat transfer from the hot emitter side (at $T_h$) to the cold collector side (at $T_c$).

Without any external ignition or other stimuli capable of initiating combustion, and preferably at substantially ambient conditions, an emitter comprising nanocatalyst particles, or a nanocatalyst comprising layer, reacts with the fuel and oxygen mixture. As defined herein, substantially ambient conditions refer to reaction initiation conditions of no more than ambient pressure with some allowance for a pressure increase upon flow of the reactants into the reactor, and a temperature of reactants of generally no more than about 40° C. The reaction releases heat and produces oxidation products, such as $CO_2$ and water in the case of common fuels such as simple alcohols. The reaction is controlled by varying the fuel/oxidant mixture.

The emitter and the separator used in the present invention can be nanostructured. In one embodiment, a nanostructured thermally insulating separator layer, such as a crystalline metal oxide separator layer, is placed between nanocatalytic particles or nanoparticle comprising layer, which act as electron emitting heating elements, and a cold collector side. The separator is a thermal insulator that also provides significant electrical conductivity. For example, a thin metal oxide separator layer (<1 micrometer thick) has much lower (for example 10 to 30%) thermal conductivity than the corresponding bulk material. Lower thermal conductivity can greatly reduce heat leakage from the hot side to the cool side of the thermionic converter, thus achieving high conversion efficiency.

High electrical conductivity is also provided by thermoelectric converters according to the invention. High electrical conductivity is obtained by controlling the thickness and composition of the separator. Electrons that are ejected from the hot nanocatalyst layer pass through the separator when the thickness of the separator is less than the mean free path of an electron in the separator material. By controlling the deposition of the crystalline metal oxide layer on the semiconductor collector, using techniques such as molecular beam epitaxy, thin layers with a distinct interface phase can be formed where the interface phase fixes the electrical characteristics that establish the junction electrostatics. The nature of such junctions are described in R. A. McKee et al. *Science,* 300, (2003) 1726-30, hereafter referred to as the "McKee Paper" and is incorporated by reference into the present application in its entirety. As a result, the figure of merit of the thermoelectric effect (ZT) is substantially improved as the separator layer becomes more conductive electrically yet less conductive thermally.

Figure 2:
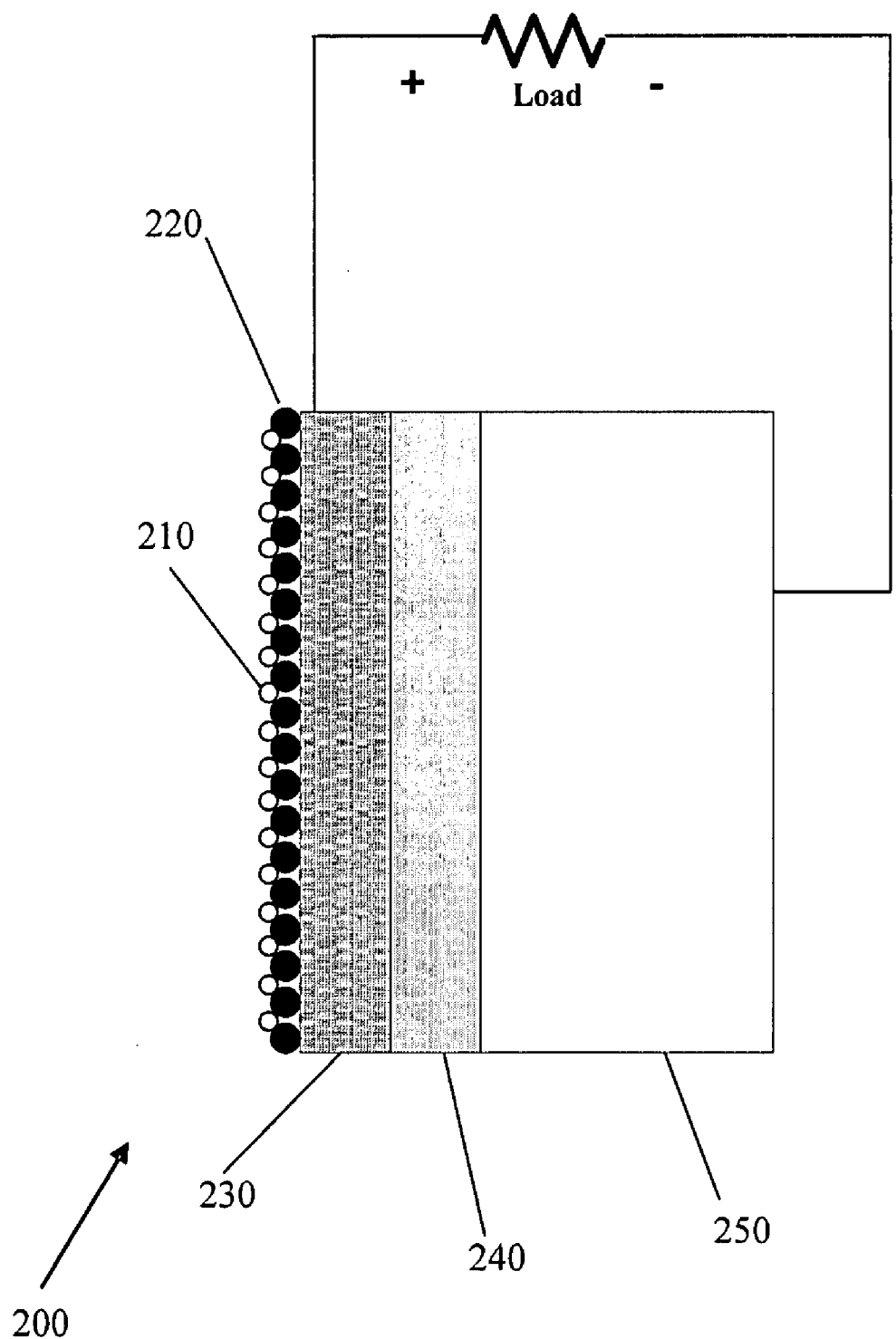
FIG. 2 shows a schematic cross-sectional view of a solid state thermionic converter according to the invention.

FIG. 2 shows schematic cross-sectional view of a solid state thermionic converter 200 according to the invention. Converter 200 includes a thermally insulating separator layer 240. As used herein, a thermal insulator refers to a thermal conductivity κ of <10 W/m·K. An emitter comprising a nanocatalyst layer with nanoparticles 220 contacting a thin metal film 230 disposed on separator layer 240. Alternatively, the nanocatalyst layer can be replaced by dispersed nanoparticles on the surface of the separator layer 240 (not shown) where electrical connectivity can be established to the nanoparticles. The average size of the nanocatalyst particles is preferably less than 500 nm, such as less than 200 nm. In one embodiment, the average size is less than 100 nm, such as 10 to 50 nm.

The nanocatalyst particles 220 are preferably sharp particles, such as shapes characteristic of formation by a mechanical method. Ideally these particles 220 have atomically sharp edges and steps. Appropriate nanoparticles can be prepared by a variety of known methods. It has been discovered that catalytic activity can be significantly improved by reducing particle size to less than 100 nm and using sharp particles. The nanocatalyst particles are capable of emitting electrons when heated. Suitable catalysts include group VIII B—Pt, Ru, Rh, Pd; group I B—Ag, Au, Cu; group II B—Zn, as well as Fe, Ni, Mn, as well as mixtures, alloys and/or oxides of these materials. The nanocatalyst particles have sharp features, and can be essentially atomically sharp. These metal nanoparticles 220 can be fixed via a silicate, aluminate or other thermally stable adhesive, such as a ceramic or glass nanoparticle layer 210, to a thin metal film 230 which is in intimate contact with the separator layer 240. The thin metal film 230 is also used to attach the leads which complete the electrical circuit of the converter. The metal film and the metal nanoparticle can be, but are not necessarily the same metal. The adhesive, such as the ceramic or glass nanoparticle layer 210, has a sufficient porous structure such that the metal nanoparticles 220 are readily contacted with the fuel/oxidant mixture. The locking of the nanoparticle 220 to the metal film 230 on the separator layer 240 is advantageous for effective function of the converter in a mobile device or any device where vibration or motion can potentially dislodge the metal nanoparticles 220 from contact with the separator layer 240.

A collector layer 250 serves as the cold side of the converter 200. Collector 250 is generally a semiconducting material, such as Si or Ge.

A thickness of the separator layer 240 is less than a mean free path of electrons in the separator layer. The mean free path of electrons in most solids is less than about 1 μm. Accordingly, the thickness of the separator can be less than or equal to 1 Mm, such as 1 μm, 900 nm, 800 nm, 700 nm, 600 nm, 400 nm, 200 nm, 100 nm, or less than 100 nm to about 1 nm. The material of separator 240 thus can be a bulk electrical conductor, bulk semiconductor, or bulk dielectric yet still provide high mobility of the ejected electrons to the collector. As the separator layer 240 also functions as a thermal insulator, often the material is a bulk dielectric.

As defined herein, a bulk electrical conductor refers to a bulk material which provides a room temperature electrical conductivity of at least 0.1 S/cm, preferably at least 1 S/cm, such as 10 S/cm, 20 S/cm, 40 S/cm, 100 S/cm, 200 S/cm or 1,000 S/cm, while a bulk semiconductor provides a conductivity of $1 \times 10^{-6}$ to 1 S/cm, and a bulk dielectric provides a bulk conductivity of less than $1 \times 10^{-6}$ S.

The invention can utilize a variety of different fuels. A combustible fuel such as methanol, ethanol, natural gas, propane or hydrogen gas can be used. Other fuels are possible. Oxygen gas, either alone or in mixtures, such as air, are preferred oxidizing agents for reacting with the fuels, although other oxidizing agents are possible.

Figure 3:
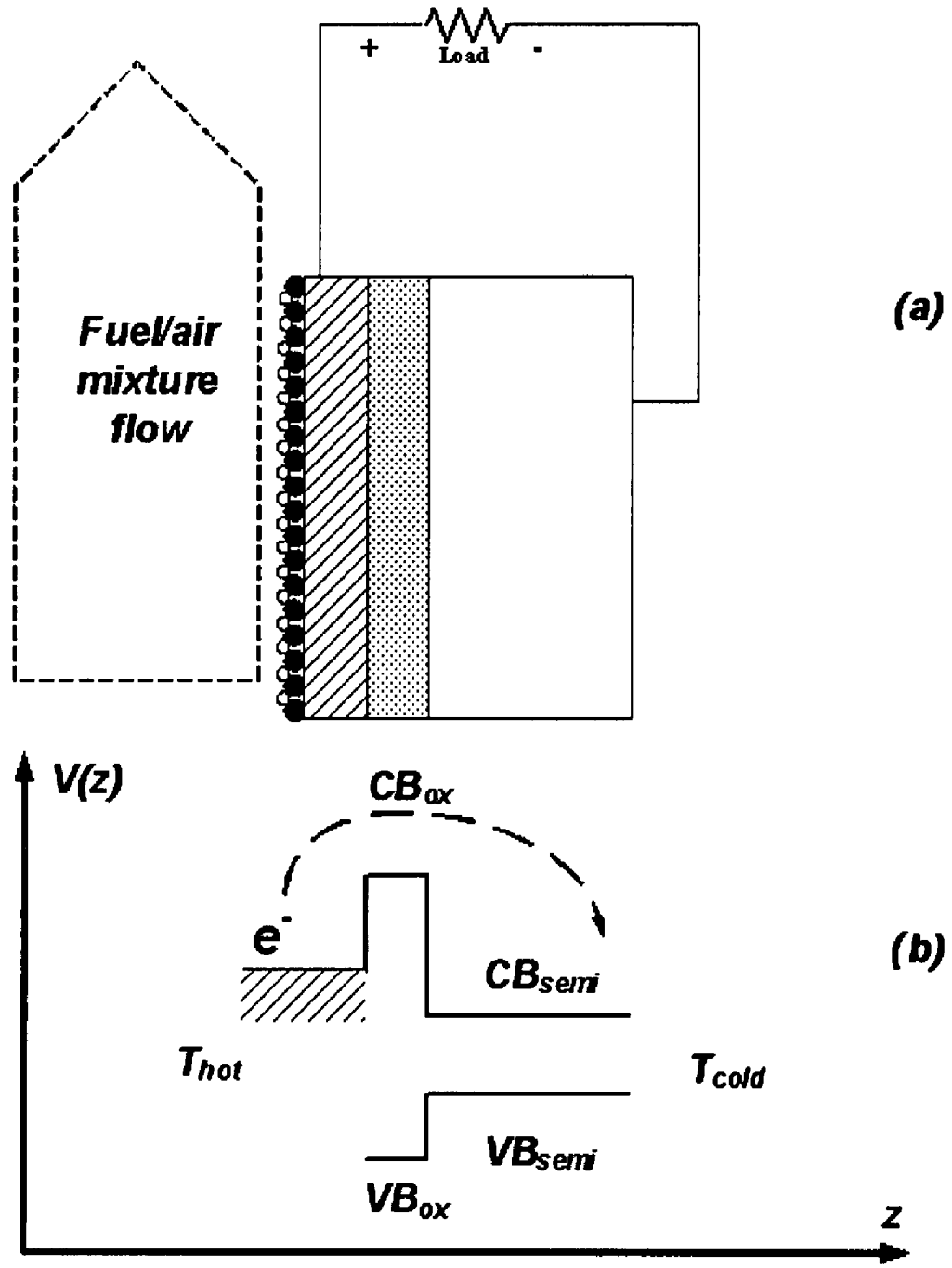
FIG. 3(b) is an exemplary band diagram for a thermionic converter (FIG. 3(a)) according to the invention.

FIG. 3(b) shows an exemplary band diagrams for a converter, such at that illustrated in FIG. 3(a) where a nanostructured metal oxide separator layer, such as $SrTiO_3$ (strontium titanate) is situated between an emitter comprising metal nanoparticles, such as Pt) and a semiconductor collector layer, such as Si or Ge. Band bending near the interfaces is not shown in FIG. 3(b). Electrons from the hot metal nanoparticles, such as Pt, are emitted over the oxide conduction band ($CB_{ox}$) barrier into the cold semiconductor to produce power. The electrical structure, shown in FIG. 3(b), requires a small barrier between the metal emitter's Fermi level and the conductance band of the oxide separator layer and the conductance band of the semiconductor collector layer. As shown, the separator provides a large band gap as compared to the band gap of the collector layer which is shown as being semiconducting. The function of a separator layer, such as $SrTiO_3$, is for thermal insulation, but the separator layer has been found to allow electrons to pass through with relatively low impedance, even for bulk dielectric materials such as $SrTiO_3$. This occurs when the layer thickness, for example 10 to 100 nm, is smaller than the electron mean-free-path in the collector material. Thus, excited electrons (thermions), which obtain enough kinetic energy to overcome the emitters work function, escape from the nanocatalyst layer and are able to reach the collector layer efficiently.

Although the invention should not be bound by any specific mechanism, it is believed that the unexpectedly high electrical conductivity and low thermal conductivity provided by separators and converters therefrom according to the present invention can be explained as follows. Conventionally, materials are classified electrically into one of conductors, semiconductors and insulators/dielectrics, which are measured in macroscale, such as in bulk form. However, in the nanoscale such classifications are insufficient to define the electrical properties. It has been found that when the physical size of a given structure is on the same order of the mean-free-path of electrons in the material, the material behaves quite differently from that of its macroscale/bulk properties. Such behavior is disclosed in the McKee Paper where the nature of the interface between materials can define the electrical properties. For example, a bulk dielectric can provide semiconducting or even electrically conducting properties at nanoscale.

There are two interfaces to be considered, emitter to separator, and separator to collector. One factor contributing to unexpectedly high electrical conductivity of converters according to the invention is believed to be obtained when the separator layer thickness is less than the electron mean free path. In this arrangement, the separator layer behaves as if it has effectively no resistance to electron flow. A large percentage of emitted electrons will then be collected at the separator/collector interface. Another factor is believed to be a built-in "forward" electrical potential where the collected electrons can continuously move through the semiconducting layer to a metal lead which offers a voltage difference, wherein the passing electrons form an electrical current thus providing an electrical power source like a battery. The built-in "forward" electrical potential structure is obtained by matching conduction band offsets. A band offset of 2.5 eV or less is conducive to the operation of the inventive thermoelectric converter. Conduction band offset of crystalline oxides on semiconductor are described in the McKee paper and also in R. A. McKee et al. *Science* 293, (2001)468-71 which is incorporated by reference herein. Obtaining the desired band offset so that the metal oxide separator matches that of the collector side of the converter can be a challenging problem. However, in the case of crystalline oxide-semiconductor band offsets, it is known that epitaxial, crystalline modifications of interfaces can adjust band offsets on the order of volts. As shown in the two papers of McKee cited herein, critical parameters for the thermoelectric devices of the invention can be manipulated using a physics-based, atomic layering approach to device fabrication and tuning this band offset so that it matches that of the semiconductor side of the thermionic couple. By performing an atomic layer deposition an interphase of a alkaline earth metal silicilide, germinide, or oxide can be formed at the interface of the metal oxide and the Si or Ge semiconductor.

Regarding thermal properties of the separator of the invention, if the electron mean free path is longer than the separator thickness, phonons are scattered more frequently at the interfaces and may experience multiple scattering events. For heat conduction perpendicular to the separator film plane (cross-plane), the phonon reflection and the corresponding thermal boundary resistance phenomena add additional resistance to the heat flow, which is manifested as a smaller effective thermal conductivity. Along the film-plane direction (in-plane), the thermal conductivity will be reduced if the interface scattering is diffuse, because diffuse scattering means some phonons that originally travel along the film plane direction are redirected backward. Nanoscale surface roughness enhances diffuse scattering. The phonon has a shorter wavelength (e.g. ~1 angstrom) than the wavelength of an electron (e.g. ~1 nm). Therefore, the surface is effectively "rougher" for phonons than the surface is for electrons. In contrast, if the interface is specular, the classical size effect model leads to an in-plane thermal conductivity of a free-standing film identical to that of the bulk material and the thin film acts simply as a waveguide for the heat flow.

Figure 4:
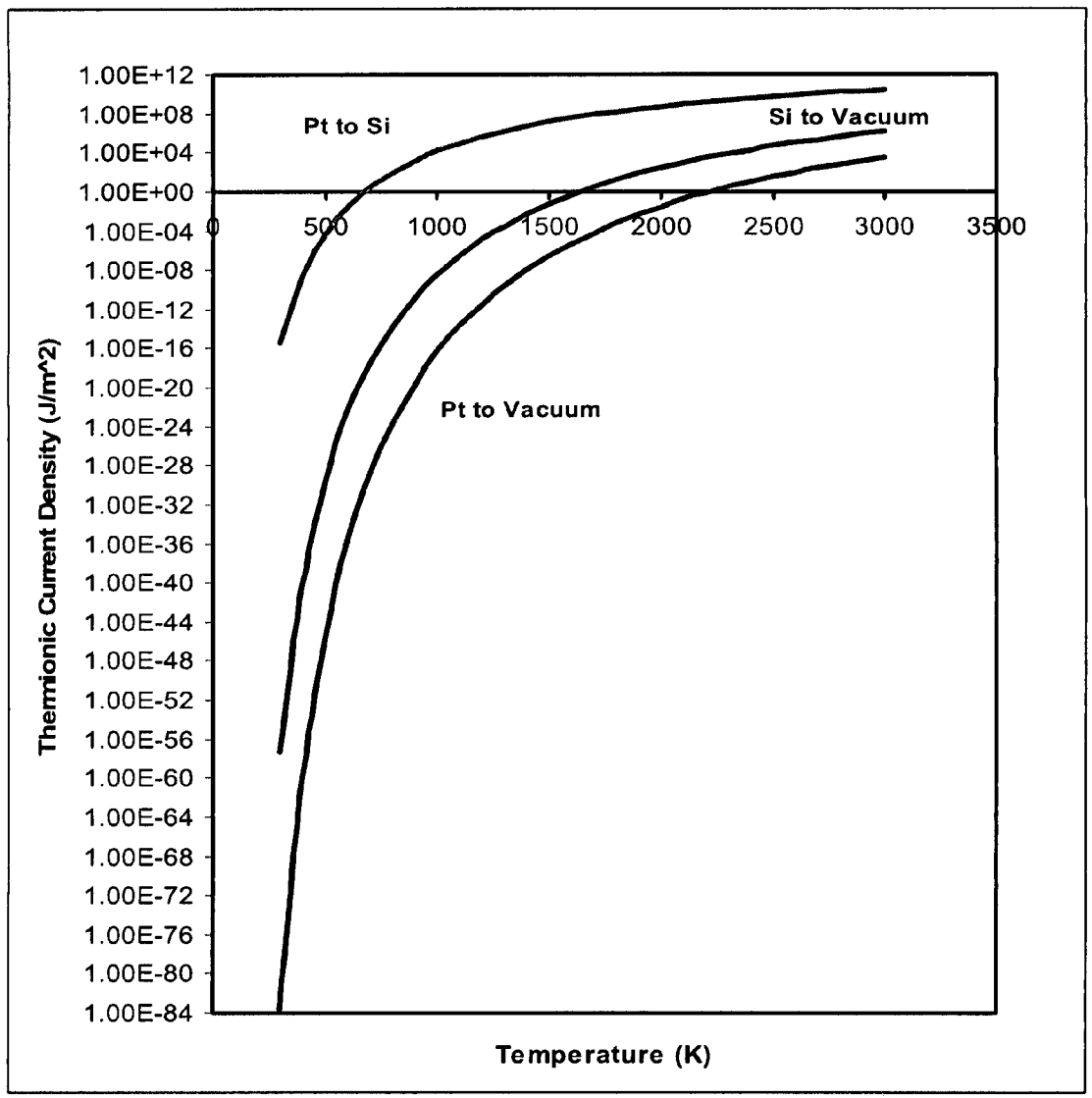
FIG. 4 shows a chart of thermionic current density achievable in a solid-to-solid system according to the invention relative to a state of the art solid-to-vacuum system.

FIG. 4 illustrates the advantage of solid-to-solid emission of the present invention over solid-to-vacuum emission of state of the art thermoelectric converters. As can be seen in FIG. 4, the current density possible for Pt-to-Si emission at about 900 K (627° C.) is similar to that for Pt-to-Vacuum at 3,000 K (2,727° C.). FIG. 4 also indicates that high current densities are possible at temperatures well below the melting points of most metals which is a desirable feature of the solid-to-solid emissions that occur in the thermoelectric converters according to the invention.

Thermoelectric converters according to the invention are well adapted for formation on an electronic substrate, such as Si, and formation using conventional integrated circuit processing. In one embodiment, the collectors are within a semiconducting substrate. An array of converters can be formed on a common substrate. The array can be hooked in parallel to provide higher current output, or in series to provide a higher voltage output. Electronic devices can also be formed on the same substrate, such as power controllers.

Figure 5:
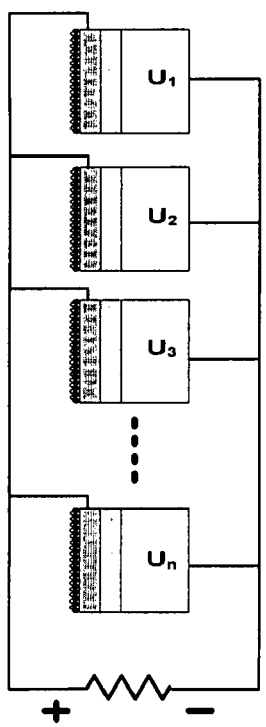
FIG. 5(a) is a schematic diagram of an exemplary array of converters according to the invention hooked in parallel.
FIG. 5(b) is a schematic diagram of an array of converters according to the invention hooked in series.
FIG. 5(c) is a schematic diagram where, according to the invention, of arrays of converters hooked in series are hocked in parallel.
Figure 5:
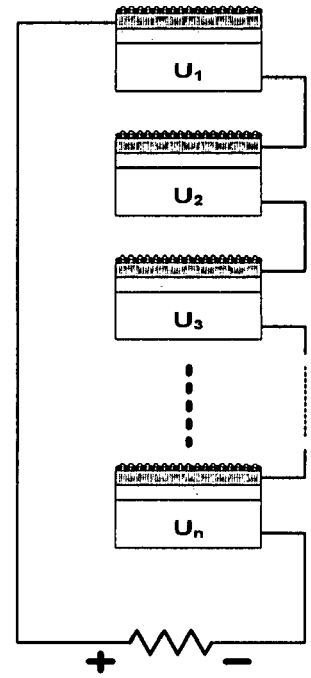
Figure 5:
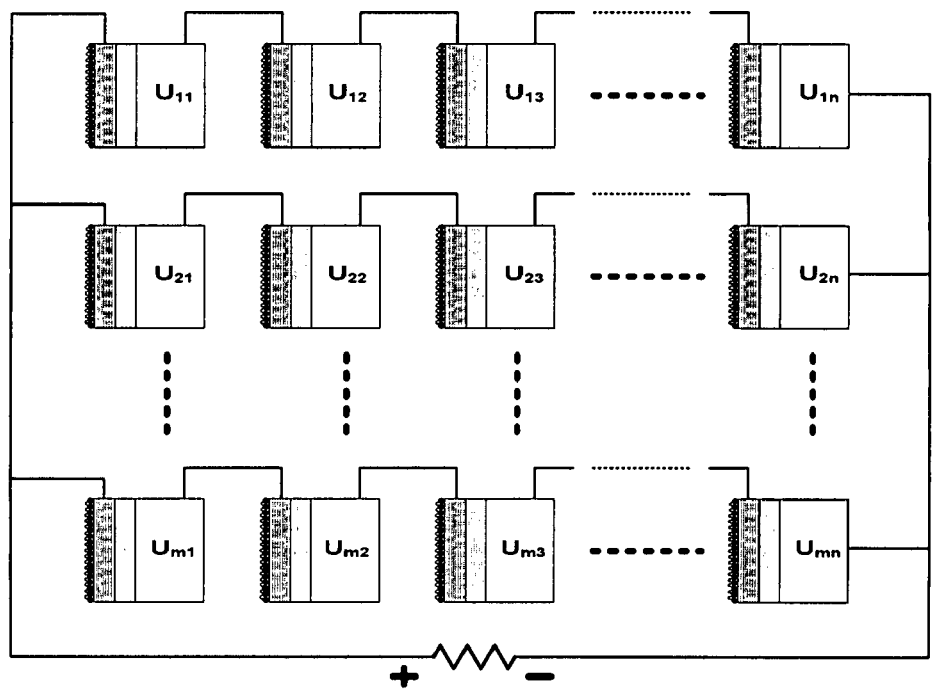

FIG. 5(a) is a schematic illustration of an exemplary array of converters according to the invention, connected in parallel, while FIG. 5(b) shows the schematic of an array of converters according to the invention connected in series. In the parallel embodiment, the respective collectors are coupled to one another, as are the respective emitters. In the series embodiment, the collector of one converter is coupled to the emitter of another converter. FIG. 5(c) shows an embodiment with arrays of converters connected in series where the arrays are connected in parallel.

Advantages of the present invention are numerous. Converters according to the present invention are environmentally friendly during both operation and disposal. Since the combustion products are generally carbon dioxide and water, thus device according to the invention can be used indoors. Such converters are more powerful, lighter and smaller than other existing technologies. Using nanoscale heterogeneous catalytic heating rather than conventional gas phase combustion and ignition removes the need for an ignition source or heating to initiate the reaction. Highly localized nano-/microscale heating zone and ultrahigh thermal gradients are generated, within a macroscale environment that is essentially cold. Converters are solid state structures with no moving parts, thus minimizing maintenance requirements. Since there are no moving parts, the device have no frictional losses when used for creating electrical power. Because heating zones are localized in very small volumes where the heat is needed, the efficiency of the device can be very high. Power generators according to the invention can be scaled from micropower supply to even industrial scale, as there is no theoretical up scale limit. Significantly, the light weight and small size of converters according to the invention makes such converted well suited for use as a portable power source for cell phones, laptop computers and other portable electronic devices.

As noted above, devices according to the invention can utilize a range of possible fuels. Fuels that can be used according to the invention include: hydrogen; hydrocarbons such as methane, ethane, propane and butane; alcohols such as methanol and ethanol; and other organic compounds, such as ethers and ketones which can generally be used with converters. The energy density of such fuels are very high, being 10~100 higher than battery systems, even accounting for the weight of a fuel storage unit. For example, the energy density of 1 kilogram methanol is about 6,300 watt-hour, which is equivalent to about 4200 units of AA-size batteries that weights about 84 kilograms.

Figure 6:
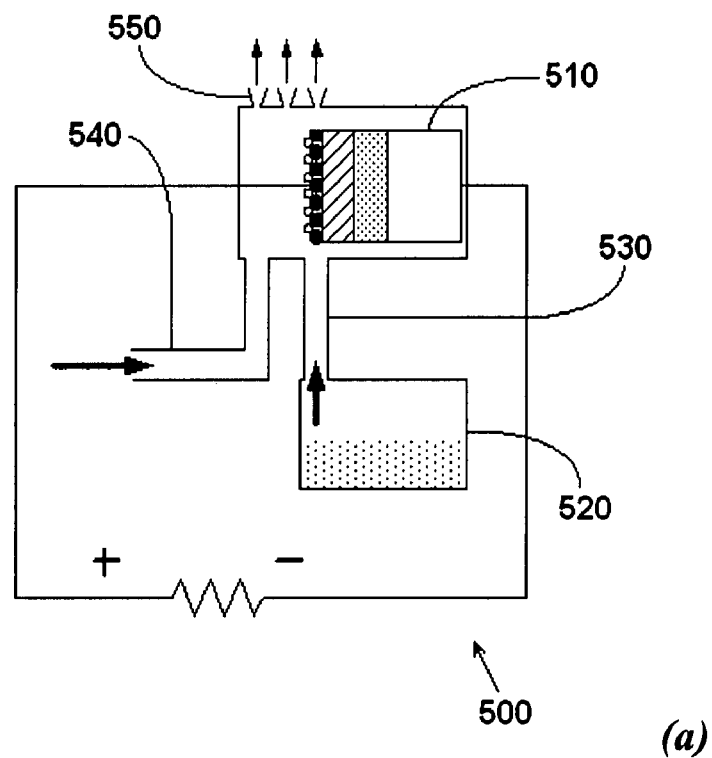
FIG. 6(a) is a schematic diagram of a system for the generation of electricity using the thermionic converter with a microfluidic fuel delivery system and fuel reservoir according to an embodiment of the invention.
FIG. 6(b) is a schematic diagram of a modified system where evaporation of the fuel is used to cool the collector layer according to an embodiment of the invention.
Figure 6:
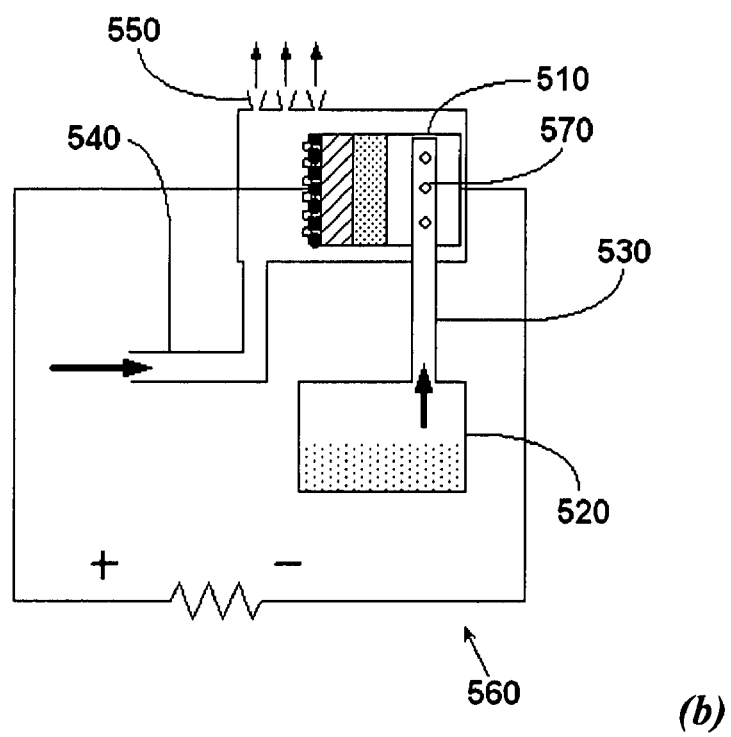

As illustrated in FIG. 6(a) one or more converters 510 can be included in a system 500 that contains a fuel reservoir 520, at least one fluidic system having at least on conduit 530 for fuel delivery, and at least one conduit 540 for air or another oxidant such as oxygen. When another oxidant is used an additional reservoir (not shown) can be used to supply the oxidant. The system also contains one or more exhaust outlets 550 such that the oxidized products can be removed from the system. Liquid fuel can be drawn into the conduits 530 at a constant rate by capillary action and gaseous fuel can likewise be brought into the system at a nearly constant pressure by proper design of the length and diameter of the conduits. The fuel reservoir 520 can also have check valves (not shown) or other passive devices to maintain a constant pressure in the fluidic system.

Microfluidics can be formed on the chip via processing as for other Microelectromechanical Systems (MEMS). For example, a built-in micro-fluidic system for fuel storage, fuel dispensing and system cooling can be provided. In this manner the fuel can be introduced with the flow of the fuel directed through channels in a portion of the semiconductor collector to provide cooling to the collector layer. The cooling can involve the vaporization of a liquid fuel or simply the heat transfer to a cool gas. Air or other oxidant can also be drawn through channels in a portion of the collector. Coolant flow can be controlled by the dimensions of the channels where, again, capillary action draws a liquid fuel from the storage vessel to the converter's nanocatalyst surface. As shown in FIG. 6(b) for a system 560, one or more fuel conduits 530 can be associated or formed within the collector 570 with outlets 580 from within or at the collector 570 such that the fuel flow can be used to remove heat from the collector 570. Alternately the oxidizer or the oxidizer and fuel can be used as coolant.

Figure 7:
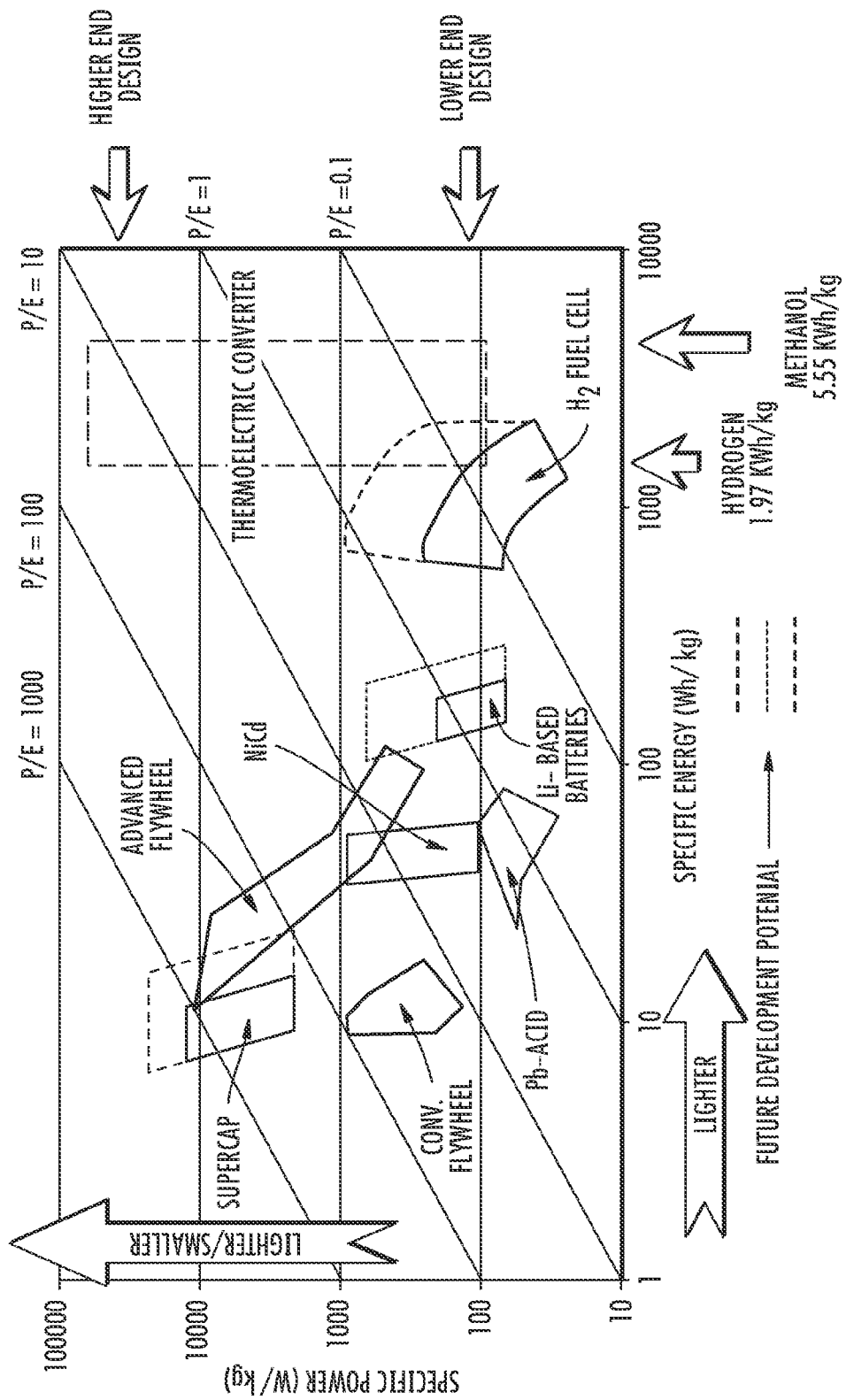
FIG. 7 is a plot of the relative location of systems according to the invention was identified in terms of specific power and specific energy in Regone Energy Plots.
Figure 8:
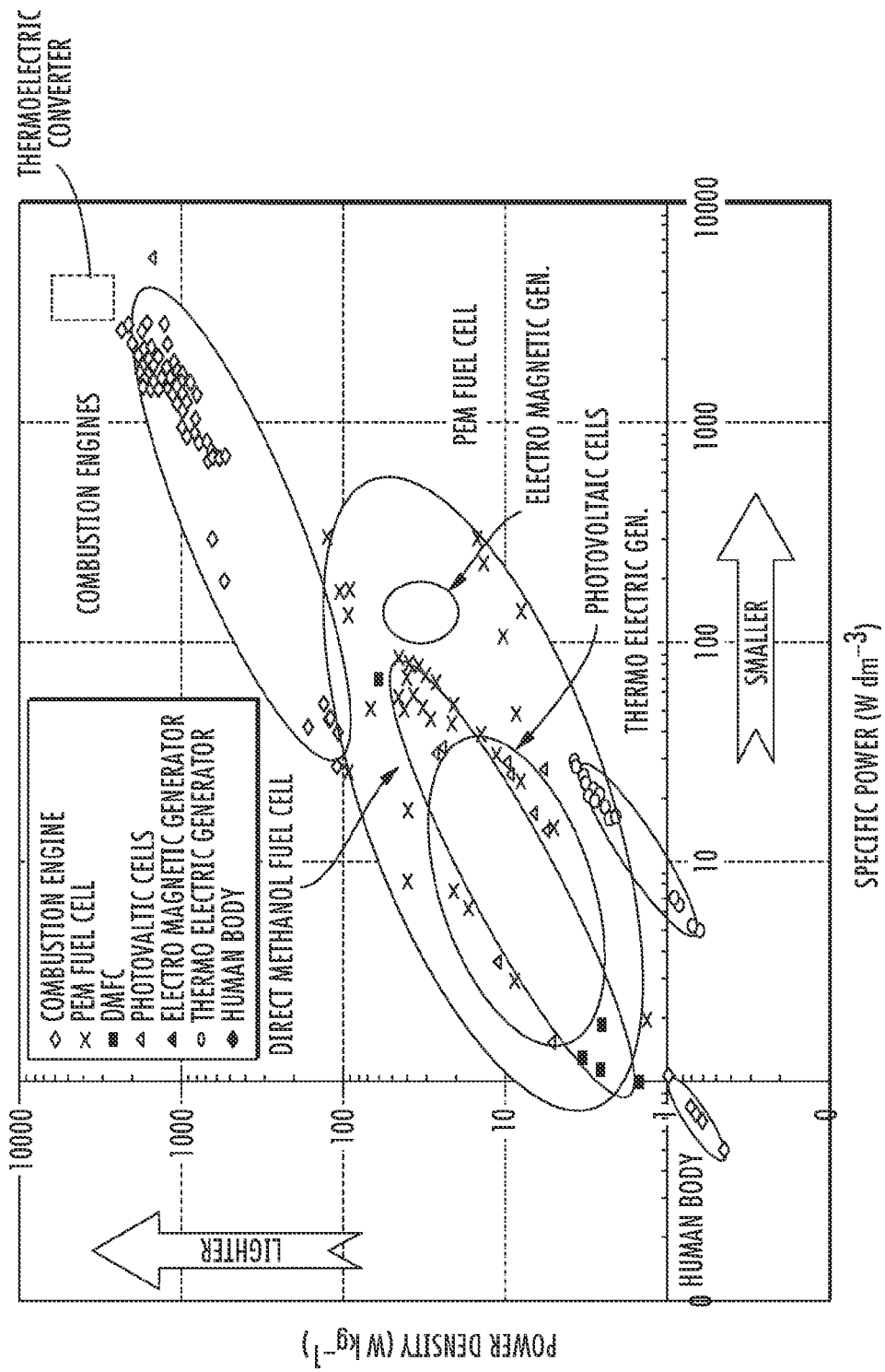
FIG. 8 is a plot of the relative location of systems according to the invention was identified in terms of specific power and specific energy in Regone Energy Plots.

Devices according to the invention have a significant advantage over other existing energy storage systems, such as batteries, and power generation systems, such as combustion engines; the relative location of systems according to the invention was identified in terms of specific power and a specific energy in two Regone Energy Plots in FIG. 7 and FIG. 8. These plots demonstrate converters according to the invention are more powerful, while being smaller than other existing power systems.

FIG. 9(a) illustrates a design of the thermoelectric converter according to an embodiment of the invention where the emitter 910, separator layer 920 and collector layer 930 are suspended in a cantilever-like manner from a supporting structure 940. This structure provides a large surface area for rapid heat exchange at the hot emitter and cool collector surfaces. In another embodiment of the invention, shown in FIG. 9(b) a bridge-like design 950 provides an additional support structure 960 yet retains a large surface area for rapid heat exchange at the hot emitter and cool collector surfaces. The separator and collector layer surfaces have been illustrated as flat, however, the interfaces between emitter and separator layer and the separator and collector layer and the surface of the collector layer opposite the separator layer need not be flat, and can be textured in any fashion. A highly partitioned surface can be used to increase the surface area as desired.

Figure 9:
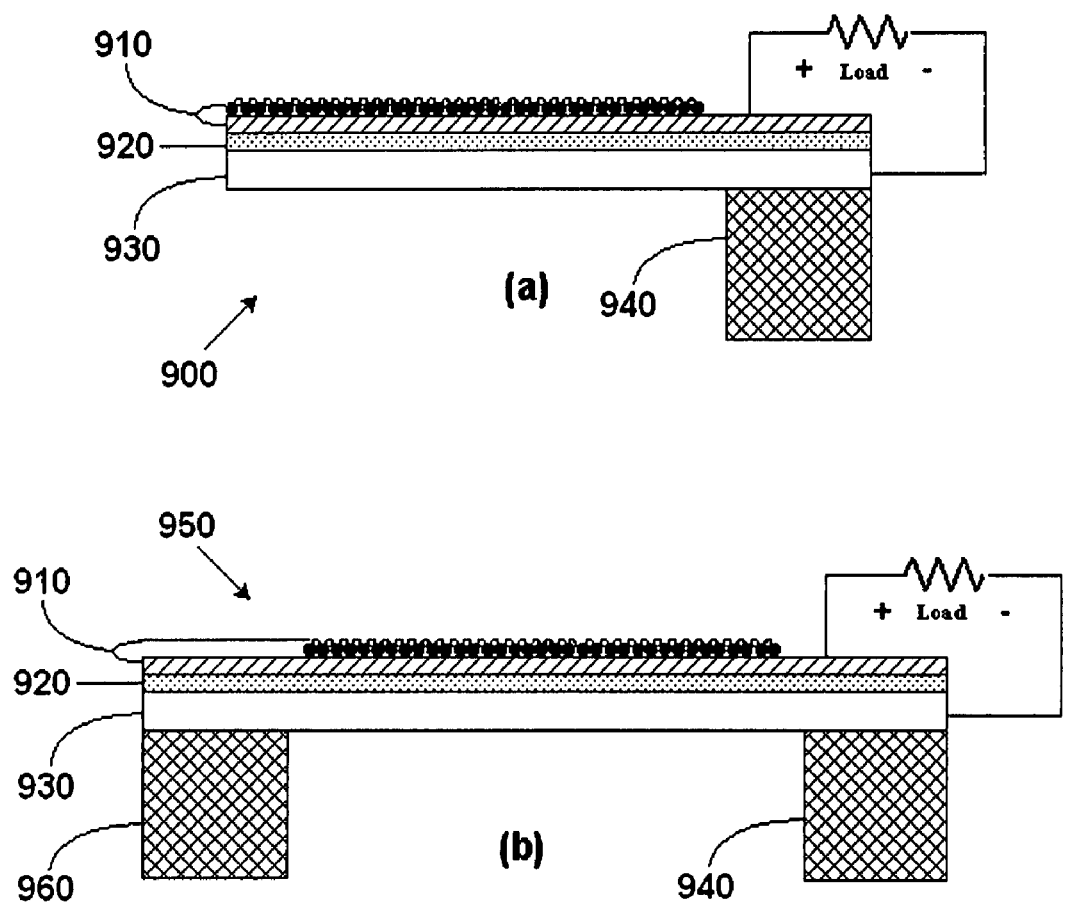
FIG. 9(a) is a schematic diagram of an embodiment of the invention wherein the collector is suspended as a cantilever-like supporting structure.
FIG. 9(b) is a schematic diagram of an embodiment of the invention wherein the collector is suspended as a bridge-like structure whereby a low thermal mass permits rapid heating and cooling in the converter.
Figure 10:
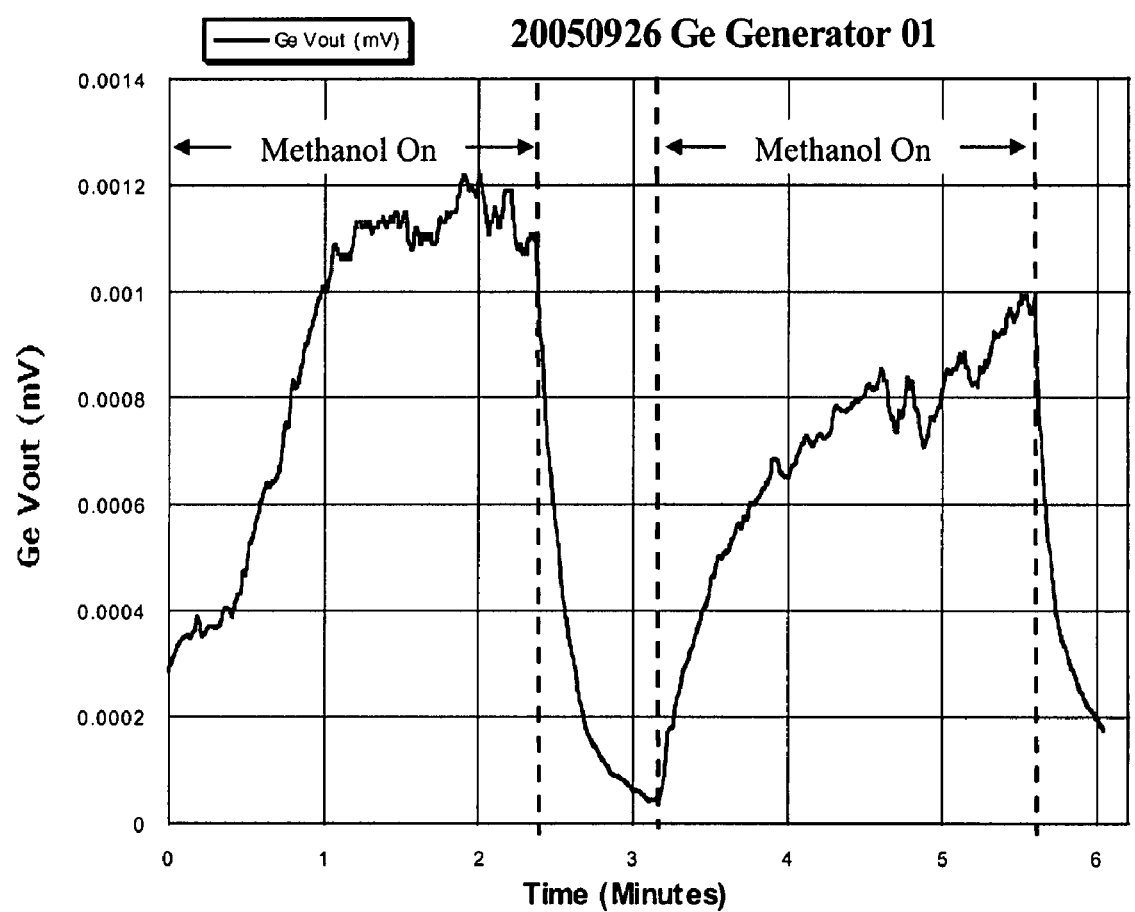
FIG. 10 is a plot of output voltage results obtained from an experiment using nanocatalytic particles to generate electric power. Germanium wafers loaded with Pt nanoparticles generated electricity in methanol vapor and air at room temperature.

The production of energy in a thermoelectric converter according to the invention where Pt nanoparticles are used on a Ge collector is shown in FIG. 9. The flow of methanol to the converter was started and an essentially constant voltage was achieved in about a minute. The flow of the methanol was stopped and the voltage drop was rapid over a period of less than 30 seconds. Starting the flow of methanol immediately resulted in an increase of a thermoelectric generated voltage.

This invention can be embodied in other forms without departing from the spirit or essential attributes thereof and, accordingly, reference should be had to the following claims rather than the foregoing specification as indicating the scope of the invention.

The invention claimed is:

1. A solid state thermoelectric converter, comprising:
   a thermally insulating separator layer;
   an electron emitter comprising a metal nanocatalytic layer or a plurality of metal nanocatalyst particles disposed on one side of said separator layer,
   a first electrically conductive lead electrically coupled to said electron emitter;
   a collector layer disposed on a second side of said separator layer, and
   a second conductive lead electrically coupled to said collector layer.

2. The converter of claim 1, wherein said collector layer comprises a semiconductor.

3. The converter of claim 2, wherein said semiconductor comprises Si or Ge.

4. The converter of claim 1, wherein said separator layer has a thickness of 1 μm to about 1 nm.

5. The converter of claim 1, wherein said separator layer comprises a crystalline metal oxide.

6. The converter of claim 5, wherein a conduction band offset of a conduction band of said separator layer to a conduction band of said collector layer is less than 2.5 eV.

7. The converter of claim 5, wherein said separator layer comprises a nanostructured layer.

8. The converter of claim 7, wherein said metal oxide comprises at least one alkaline earth oxide and wherein the collector layer is Si.

9. The converter of claim 8, wherein said metal oxide and said Si has an interface comprising an alkaline earth silicide.

10. The converter of claim 5, wherein said metal oxide comprises $(AO)_n(A'BO_3)_m$ wherein A and A' are one or more alkaline earth metals, B is titanium, n is 0 to 3 and m is 0 to 100.

11. The converter of claim 10, wherein said $A'BO_3$ is $SrTiO_3$ and said collector is Si.

12. The converter of claim 10, wherein said $A'BO_3$ is $BaTiO_3$ and said collector layer is Ge.

13. The converter of claim 1, wherein said metal nanocatalyst particles have an average size of less than 200 nm.

14. The converter of claim 1, wherein said electron emitter is selected from the group of metals consisting of Au, Pt, Ru, Rh, Pd, Ag, Cu, Zn, Fe, Ni, and Mn, and alloys thereof.

15. A thermoelectric system for generating electricity, comprising:
    at least one thermoelectric converter comprising:
    a thermally insulating separator layer;
    an electron emitter comprising a metal nanoparticle layer or a plurality of metal nanocatalyst particles disposed on one side of said separator layer,
    a first electrically conductive lead electrically coupled to said electron emitter;
    a collector layer disposed on a second side of said separator layer, and
    a second conductive lead electrically coupled to said collector layer;
    a substrate, wherein said at least one converter is disposed on or disposed within said substrate; and
    at least one fluidic system coupled to said converter wherein said fluidic system delivers a fuel and an oxidant to said emitter of said converter.

16. The system of claim 15, wherein said converters are electrically connected in series, parallel or a combination of series and parallel.

17. The system of claim 15, wherein said fluidic system is disposed on or disposed within said substrate.

18. The system of claim 15, further comprising a reservoir for storage of said fuel.

19. The system of claim 18, wherein said fuel comprises hydrogen, a hydrocarbon or an alcohol.

20. The system of claim 15 wherein said fluidic system further provides cooling to said converter.

21. A thermoelectric method of generating electricity, comprising the steps of:
    providing at least one thermionic converter comprising a thermally insulating separator layer; an electron emitter comprising a metal nanoparticle layer or a plurality of metal nanocatalyst particles disposed on one side of said separator layer, and a collector layer disposed on a second side of said collector layer;
    supplying a fuel and an oxidant to said electron emitter, wherein said fuel and oxidant spontaneously react on the surface of said emitter generating heat sufficient to cause thermionic emission of electrons from said electron emitter, and
    solid-to-solid emitting of said electrons through said separator layer to said collector layer wherein said emitter and said collector layer are connected by a conductor.

22. The method of claim 21, wherein said thickness of said separator layer is less than a mean free path of electrons in said separator layer.

23. The method of claim 21, further comprises the step of combining outputs from each of a plurality of said converters.

24. The method of claim 21, further comprising coupling an output of said converter to a portable electronic device, wherein said converter supplies power to said portable electronic device.

25. The method of claim 24, wherein said portable power device comprises a personal digital assistant (PDA), cellular phone or laptop computer.

* * * * *